United States Patent [19]

Chang et al.

[11] Patent Number: 5,122,663
[45] Date of Patent: Jun. 16, 1992

[54] COMPACT, INTEGRATED ELECTRON BEAM IMAGING SYSTEM

[75] Inventors: Tai-Hon P. Chang, Chappaqua, N.Y.; Harry J. Mamin; Daniel Rugar, both of Palo Alto, Calif.

[73] Assignee: International Business Machine Corporation, Armonk, N.Y.

[21] Appl. No.: 734,986

[22] Filed: Jul. 24, 1991

[51] Int. Cl.$^5$ ............................................. H01J 37/26
[52] U.S. Cl. .................................. 250/310; 250/397; 346/158; 369/101
[58] Field of Search ............... 250/306, 307, 310, 311, 250/397; 346/158; 369/126, 101

[56] References Cited

U.S. PATENT DOCUMENTS

| | | | |
|---|---|---|---|
| 4,760,567 | 7/1988 | Crewe | 369/101 |
| 4,786,922 | 11/1988 | Hosoki et al. | 346/158 |
| 4,896,045 | 1/1990 | Okunuki et al. | 250/310 |
| 5,061,856 | 10/1991 | Frosier et al. | 250/397 |

Primary Examiner—Jack I. Berman
Attorney, Agent, or Firm—Perman & Green

[57] ABSTRACT

An electron beam imaging system is described wherein a sharp-tip electron source is biased to produce an electron flow and a conductive target is placed in the path of the electron flow. A planar, electrostatic lens is positioned in the electron flow path and between the electron source and target. The lens includes an aperture; at least a first conductive plane that is biased less negative than the electron source; and one or more conductive planes separated by dielectric layers. A secondary electron detector is formed on the surface of the electrostatic lens that is closest to the conductive target, whereby the lens may be positioned close to the target and still not obstruct secondary electrons emitted from the target from impinging on the secondary electron detector.

13 Claims, 3 Drawing Sheets

COMPACT, INTEGRATED ELECTRON BEAM IMAGING SYSTEM

THE FIELD OF THE INVENTION

This invention relates to electron beam imaging, and more particularly, to an electron beam imaging system which employs an integrated microlens/secondary electron detector for improved imaging and is suitable for use as a read-write head in an electron beam-based data storage system.

BACKGROUND OF THE INVENTION

The use of low-mass tips as cathodes or electron sources for imaging purposes is known in the prior art. Field emission tips are commonly used, for example, in scanning electron microscopes because they provide a high brightness source. The electron optics which are used with such tips are typically relatively large discrete components with length scales on the order of centimeters.

More recently, the advantages of compact electron optics have begun to be appreciated. The advantages are at least two-fold. First, as the size of the optics is scaled down, the focal length also scales, as do the aberrations in the electron lenses. With smaller aberrations, a smaller spot size and higher current density are possible. Second, a small, low-mass electron optics system can be mechanically scanned, reducing the need for high voltage deflection plates to alter the electrons' trajectory and allowing new applications.

One such example is described in U.S. Pat. No. 4,760,567 to Crewe. This patent describes a compact, low-mass electron beam head for use in a high-density data storage device. In this system a field emission cathode is employed to write data on a rotating disk. An electrostatic focus lens is used to position the electron beam on the disk. The method of reading is not fully described. In particular, it is not specified how a read head would be positioned so as not to interfere with either the disk or the write head.

Recent advances in photolithography have made even more compact electron optics possible. Recently, Chang et al. have described the use of a scanning tunneling microscope, controlled field emission tip in conjunction with a microlens to form a high brightness electron source. The microlens is disclosed in various configurations. One arrangement that is non-focusing comprises a bias plane with a micro aperture that is positioned beneath the field emission tip. Another configuration, which can act as a focusing lens, includes a double conductive plane separated by an insulating layer; and a third includes three or more conductive planes separated by insulating layers. Those microlens structures enable the physical removal of the field emission electron source from the immediate vicinity of the sample's surface (as would be the case in a scanning tunneling microscope), but still enable a highly focused beam to impinge on the sample's surface. See "A Novel Scanning Tunneling Microscope Controlled Field Emission Microlens Electron Source" and "Electron Optical Performance of A Scanning Tunneling Microscope Control Field Emission Microlens System" Chang et al., Journal of Vacuum Science Technology, Vol. B7 No. 6, Nov/Dec 1989 pages 1851–1861, and Chang et al., Journal of Vacuum Science and Technology, B8, No. 6, Nov./Dec. 1990, page 1702.

The Chang et al microlens system constitutes a general purpose high-brightness electron source which can be used in place of a conventional electron beam column, for example for electron beam lithography. It does not, by itself, constitute an imaging system. It may be used for imaging, however, when combined with a detector of secondary electrons. Secondary electrons are emitted from a surface when electrons from an electron beam source, such as a microlens system, impinge on the surface with sufficient energy. The direction and degree of secondary electron emission depends strongly on the surface geometry. Emission of high-energy backscattered electrons can occur as well, depending on the surface material properties. A conventional scanning electron microscope (SEM) detects secondary electrons to generate its image. Material contrast can also be obtained using backscattered electrons.

The concept of using secondary electron detection in an electron beam memory device has been disclosed in a number of patents.

In U.S. Pat. No. 3,750,117 to Chen et al., an electron beam addressable memory is described where information is stored at deformations in a thin film. Read out is accomplished by scanning the film with an electron beam and determining the stored information by variations in secondary electron emission yield due to deformations in the film. A similar type of beam-accessed memory system is described by Nagao et al. in U.S. Pat. No. 4,748,592. It, too, employs emitted secondary electrons as indications of stored data in the storage media. Secondary electron detection has also been employed in field-emission scanning Auger electron microscopy, e.g. see U.S. Pat. No. 4,698,502 of Bednorz et al.

Other prior art that speaks to electron beam imaging systems can be found in the following:

U.S. Pat. No. 4,785,189 to Wells, U.S. Pat. No. 4,962,480 to Ooumi et al., U.S. Pat. No. 4,004,182 to Nixon, U.S. Pat. No. 4,896,045 to Okunuki et al., U.S. Pat. No. 4,823,004 to Kaiser et al., U.S. Pat. No. 4,343,993 to Binnig et al., U.S. Pat. No. 4,396,996 to Oldham, U.S. Pat. No. 4,575,822 to Quate, U.S. Pat. No. 4,785,437 to Dransfeld, U.S. Pat. No. 4,829,507 and U.S. Pat. No. 4,907,195 to Kazan et al., U.S. Pat. No. 4,968,888 to Appelhans, et al., U.S. Pat. No. 4,829,177 to Hirsch, U.S. Pat. No. 4,831,614 to Duerig et al. U.S. Pat. No. 4,791,301 to Nozue et al., U.S. Pat. No. 4,835,385 to Kato, U.S. Pat. No. 4,871,912 to Kokubo et al, U.S. Pat. No. 4,874,945 to Ohi, U.S. Pat. No. 4,954,704 to Ellings et al., U.S. Pat. No. 4,861,990 to Coley, U.S. Pat. No. 4,958,074 to Wolf et al., U.S. Pat. No. 4,902,892 to Okayama et al., and Re. 32,457 to Matey.

Disclosures of a similar nature can be found in the following Japanese published Patent Applications: 1-159,954 (A) to Oi, 62-31932(A) to Hirai, 62-137835(A) to Morizumi, 62-143355(A) to Fukuhara, 63-952(A) to Okubo, 63-12,148(A) to Tsukajima, 63-265,105(A) to Tamura, 1-287404(A) to Nishikawa and Kokai No. 54-105440 to Maebotoke.

Other published references generally describing electron beam writing and field emission tip electron beam generation can be found in "The Topografiner: An Instrument For Measuring Surface Microtopography" by Young et al., Review of Scientific Instruments, Vol. 43, No. 7, July 1972 pages 999–1011; "A High Density Data Storage System Based on Electron Beam Writing" by Berger et al., Inst. Phys. Conf. Serial No. 90: Chapter 4 presented at EMAG 87, Manchester, 8–9

Sept. 1987, pages 93-96; "Scanning Tunnelling Microscope Instrumentation", Kuk et al., Review of Scientific Instruments, Vol. 60, No. 2, Feb. 1989, pages 165-180 and "Magnetic Information Storage Apparatus" by Kump et al, IBM Technical Disclosure Bulletin, Vol. 9, No. 11, April 1967 page 1601. Published references describing microfabrication of field emitter tips can be found in "Physical Properties of Thin-Film Field Emission Cathodes with Molybdenum Cones" by Spindt et al., Journal of Applied Physics, Vol. 47, No. 12 Dec. 1976 page 5248, and "Formation of Silicon Tips with <1 nm Radius" by Marcus et al., Applied Physics Letters, Vol. 56, No. 3 Jan. 1990 page 236.

It is therefore an object of this invention to provide an electron beam imaging system which employs a high brightness electron source, but uses secondary electron detection for imaging.

It is another object of this invention to provide an electron beam imaging system with an improved, integrated secondary electron detector.

SUMMARY OF THE INVENTION

An electron beam imaging system is described wherein a sharp-tip electron source is biased to produce an electron flow and a conductive target is placed in the path of the electron flow. A planar, electrostatic lens is positioned in the electron flow path and between the electron source and target. The lens includes an aperture; at least a first conductive plane that is biased less negative than the electron source; and one or more conductive planes separated by dielectric layers. A secondary electron detector is formed on the surface of the electrostatic lens that is closest to the conductive target, whereby the lens may be positioned close to the target and still not obstruct secondary electrons emitted from the target from impinging on the secondary electron detector.

The aperture and lens structures can be fabricated photolithographically. The secondary detector can be microfabricated using the same techniques. Because the electron source can be operated with extremely high brightness, the flux of secondary electrons will be similarly high. For this reason, the detector does not require either an excessively large solid angle for collection nor a high positive bias potential to enhance the collection to achieve a high signal to noise ratio. Because of the integrated structure, the device can be made in array form, for parallel imaging or reading and writing.

DETAILED DESCRIPTION OF THE INVENTION

Figure 1:
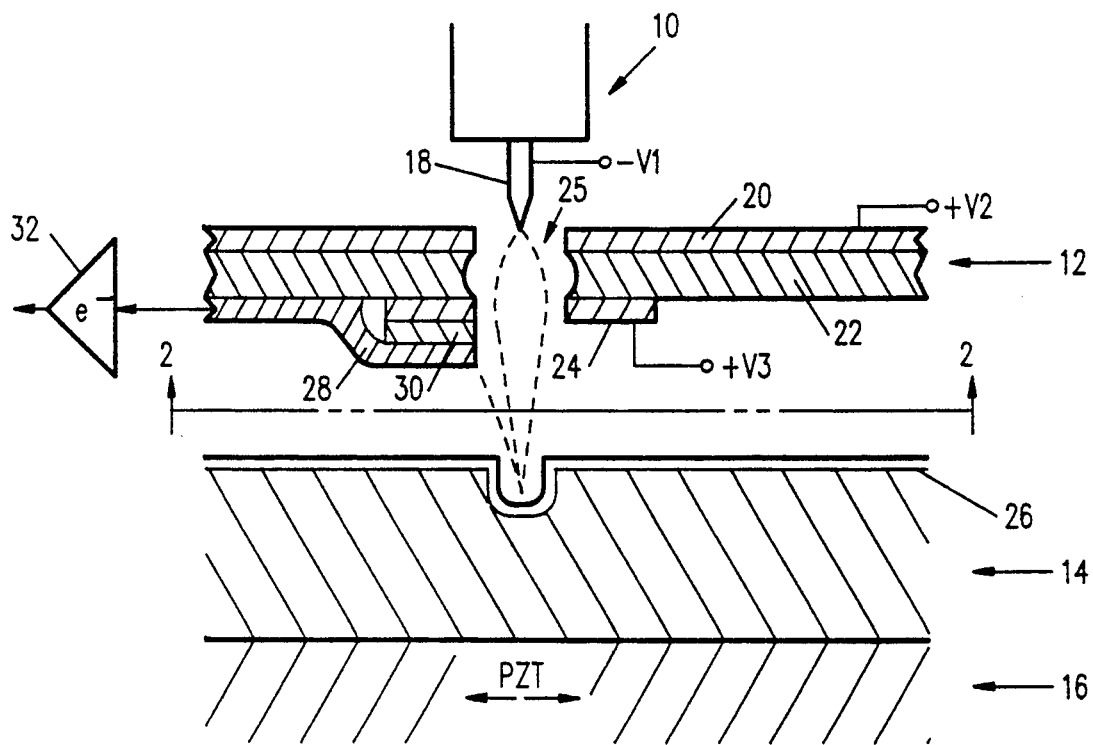
FIG. 1 is a schematic side view of an electron imaging system which incorporates the invention hereof.

Referring now to FIG. 1, an electron beam imaging system constructed in accordance with the invention comprises a sharp tip electron source 10, a planar electrostatic lens 12, a substrate 14 and a stage 16 which may, for instance, be a known PZT actuator. Electron source 10 is provided with a tip 18 that has a voltage $-V1$ applied which enables it to operate in the field emission mode. Electrostatic lens 12 comprises a conductive sheet 20 and a juxtaposed dielectric layer 22. An annular ring of conductor 24 is emplaced on the lower surface of dielectric layer 22 and about an aperture 25 that passes through each of the aforesaid layers. Potential sources V2 and V3 are respectively connected to conductors 20 and 24 so as to create an electrostatic focusing action on the emitted electrons from tip 18. To extract electrons into free space, the electrons must experience an overall accelerating voltage. In this case, that implies $V3-(-V1)>0$. In the case of three or more conducting layers, the condition is that $Vf-(-V1)>0$, where Vf is the voltage on the electrode closest to the sample. In the case shown here, the potential difference $V3-(-V1)$) is generally greater than the difference $(V2-(-V1))$ in order to achieve focusing action.

Generally the target will be held at potential V3, so that no electric field exists in the free space region between the lens and the target. It is possible, however, to place a different bias voltage on the target, in which case the target can be considered as part of the lens and can provide additional electrostatic focusing. Alternatively, the target may be held at a potential which is slightly negative with respect to the secondary detector in order to enhance the collection of the secondary electrons.

As a result of the focusing action of microlens 12, emitted electrons from tip 18 are focused onto a conductive surface 26 of sample 14 and cause secondary electrons to be emitted therefrom. Those secondary electrons travel back towards the underside of microlens 12 and impinge upon a conductive region 28. Conductive region 28 is separated from annular conductor 24 by a layer of dielectric material 30.

Figure 2:
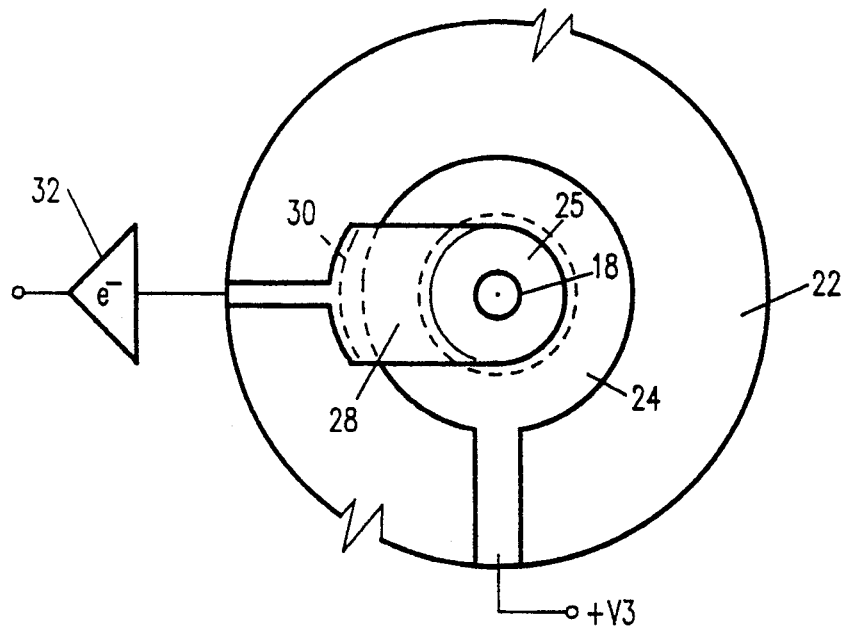
FIG. 2 is a view of FIG. 1, taken along line 2—2.

The underside structure of microlens 12 can be further visualized by referring to FIG. 2 wherein, a plan view is shown taken along line 2—2. Secondary electrons impinging upon conductive region 28 create a current therein which is sensed by amplifier 32 that, in turn, provides an output indicative of the changes in secondary electron emission from surface 26.

As can be seen from FIGS. 1 and 2, an electrostatic lens 12 that was used in the prior art strictly as an electron beam source is used herein in a scanning electron microscope (SEM) arrangement. By modifying the Chang et al. electrostatic lens to include a secondary electron detector 28 on the sample-side of the lens, secondary electron collection is enhanced due to the closeness of detector 28 to the source of the secondary electrons. Furthermore, the structure remains compact and can be placed physically close to the sample surface.

It is to be noted that in most SEMs, the secondary electron detector only detects electrons with energies on the order of 1-50 of eV. Since the energies of the backscattered electrons may have energies up to that of the primary beam, which may be tens of keV, these electrons generally require a separate detector. In the microlens geometry, the backscattered and secondary electrons may have energies which are comparable. The detector described herein can collect both types, eliminating any motivation for separate detectors.

Figure 3:
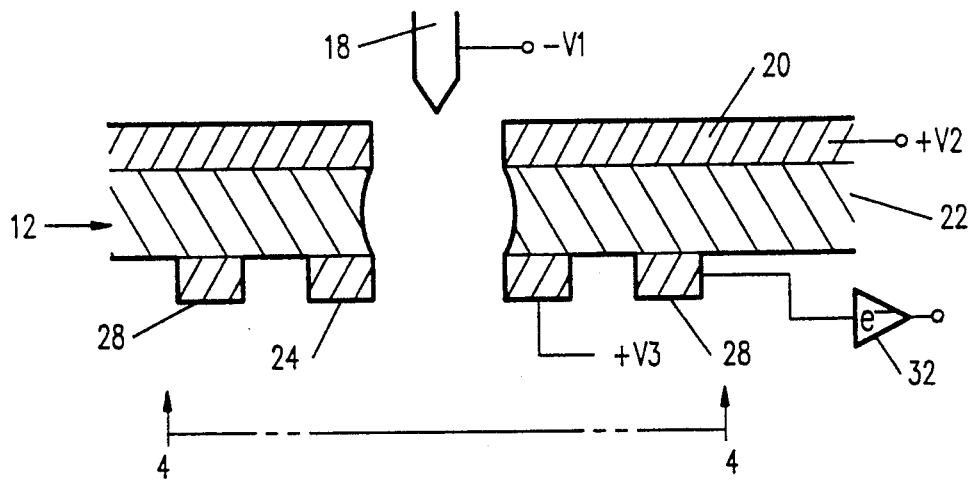
FIG. 3 is a side/section view of another embodiment of the invention.
Figures 4, 4A:
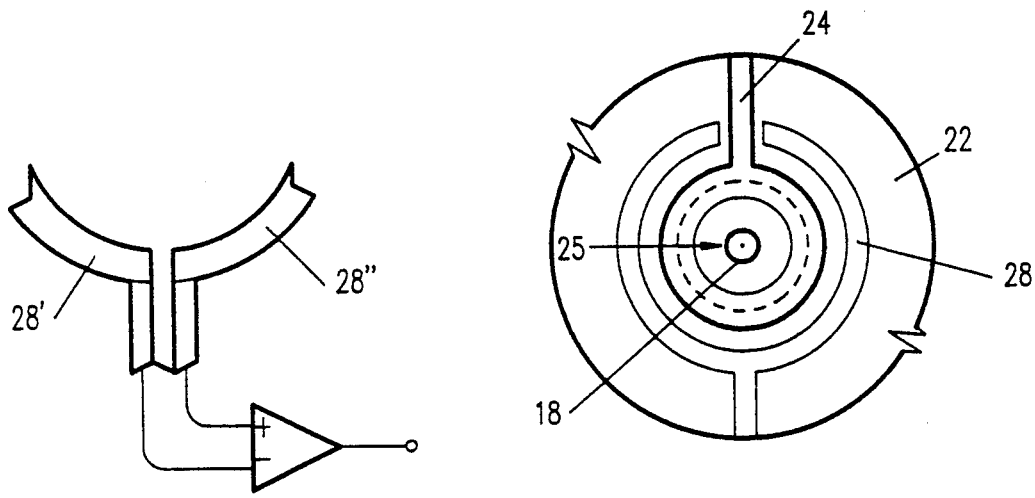
FIG. 4 is a view of FIG. 3 taken along line 4—4.
FIG. 4a is a modification of the embodiments of FIGS. 3 and 4.

Turning now to FIGS. 3 and 4, a modification of the system of FIGS. 1 and 2 is shown wherein secondary electron detector 28 has been removed from aperture 25 and emplaced thereabout as a further annular conductor 22. This enables electron detector 28 and lens annular conductor 24 to be formed simultaneously without an intermediate deposition of dielectric material 30 (see FIG. 1).

FIG. 4(a) shows a modification of the structure of FIGS. 3 and 4. Secondary electron detector conductor 28 has been segmented into two separate semi-annular conductors 28' and 28". By feeding outputs from conductors 28' and 28" to a differential amplifier, common mode noise can be rejected and positional and directional information acquired in the detection of the secondary electrons. While only two segments are shown in FIG. 4(a), it is clear to one skilled in the art that annular conductor 28 could be segmented into four separate sections to enable further position-sensitive detection to be achieved.

Figure 5:
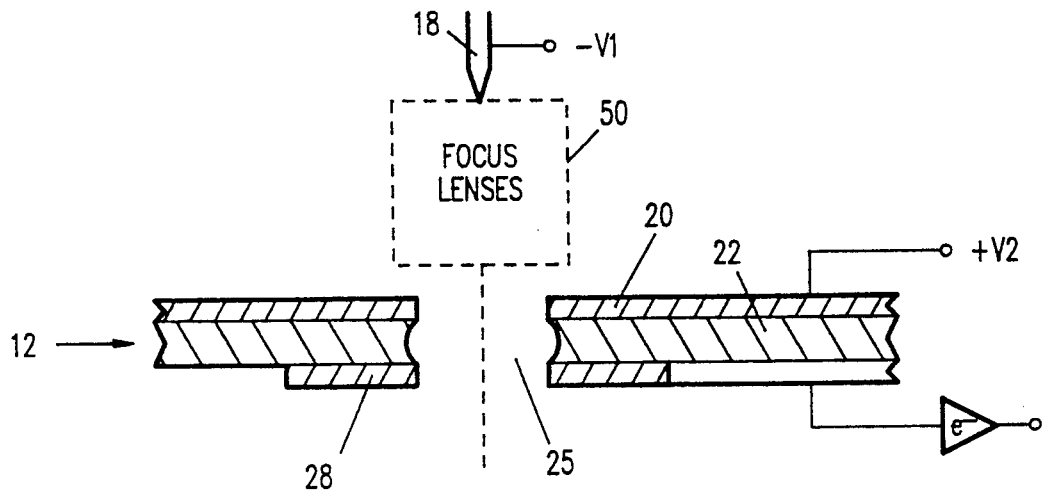
FIG. 5 is a schematic side view of another embodiment of the invention.

In FIG. 5, another embodiment- of the invention is shown wherein the focusing action by the electrostatic lens is less demanding. In this instance, a focusing lens arrangement, shown schematically at 50, may be interposed between electron source 18 and conductive plate 20. The conducting plate 20 may be physically connected to or part of the focusing arrangement 50. Under these circumstances, a second layer of electrostatic focusing conductive material is not required and an annular secondary electron detector 28 can be directly emplaced on dielectric layer 22 without an interposed conductive annular focusing conductor. In the structure shown in FIG. 5, secondary electrons are sensed by annulus 28 in the same manner as that described above in FIGS. 1 and 4.

Figure 6:
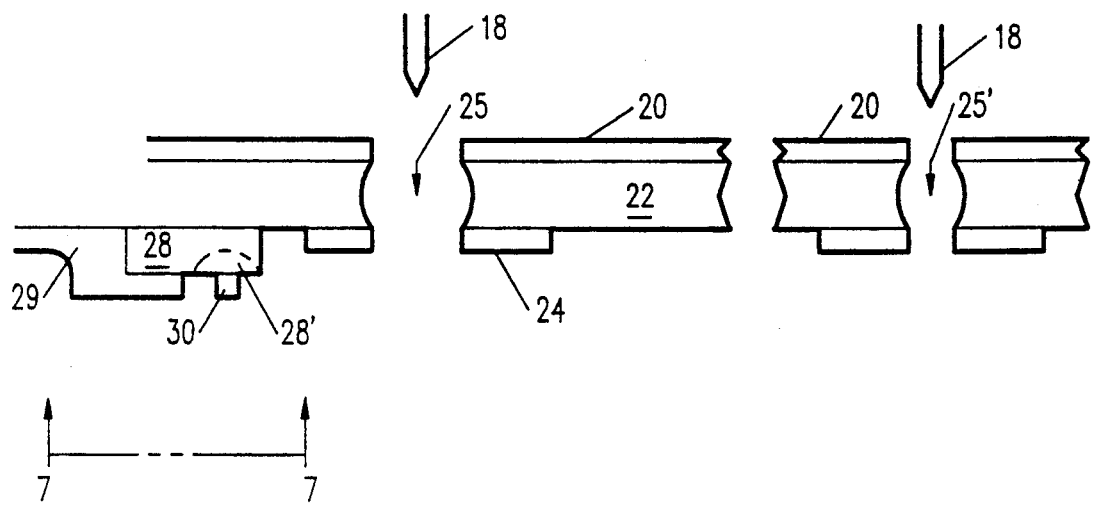
FIG. 6 is a schematic side view of another embodiment of the invention.
Figure 7:
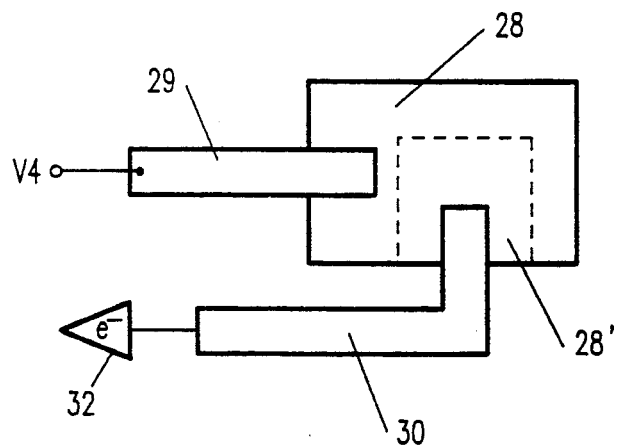
FIG. 7 is a plan view of FIG. 6 taken along line 7—7.

Another modification is shown in FIG. 6. The conducting electrode 28 is replaced by a shallow semiconductor junction such as a pn or pin junction. As shown, region 28 is n-doped silicon and region 28' is p-doped, forming a pn junction. Metal leads 29 and 30 are attached to make electrical connection to the junction. The doping levels in the silicon can be adjusted in wellknown ways to avoid formation of Schottky barriers. One lead is either grounded or biased with a voltage V4, and the other lead goes into the operational amplifier 32 (see FIG. 7). These shallow junctions can provide significant gain which may be useful for cases of small flux of secondary electrons. Again, this detector may be microfabricated at the same time as the optical structure, giving the usual advantages of integration, such as batch fabrication and compactness. For instance, the tip, lens, aperture (e.g. 18', 25') may be fabricated as an array to enable parallel operation.

Finally, it should be pointed out that the field emission tip itself may be made via microfabrication out of silicon or other materials such as molybdenum, tungsten or niobium. Besides having the usual advantages of microfabrication, these tips can be extremely sharp, with sub-nanometer radii of curvature. It is understood that the tip 18 may be of this type, so that virtually the entire electron source, optics and detector may be microfabricated as an integrated unit.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. An electron beam imaging system comprising:
    a sharp-tip electron source biased to produce an electron flow;
    a conductive target in the path of said electron flow;
    planar electrostatic lens means positioned in said electron flow and between said electron source and said conductive target, said planar electrostatic lens means including an aperture through which said electrons can flow, and at least a first biased conductive plane and a dielectric plane supporting said first conductive plane; and
    a secondary electron detector formed on a surface of said electrostatic lens means that is disposed closest to said conductive target, whereby said electrostatic lens means may be positioned close to said target and not obstruct secondary electrons impinging on said secondary electron detector.

2. The electron beam imaging system of claim 1, wherein said secondary electron detector is positioned adjacent said aperture.

3. The electron beam imaging system of claim wherein said secondary electron detector is an annulus that surrounds said aperture.

4. The electron beams imaging system of claim 2 wherein said electrostatic lens means includes a second conductive plane disposed on a side of said dielectric plane that is opposite to said first conductive plane, and said secondary electron detector comprises:
    a further insulating layer disposed on said second conductive plane and adjacent said aperture; and
    a conductor disposed adjacent said aperture and on said further insulating layer.

5. The electron beam imaging system of claim 1 wherein said electrostatic lens means includes an annular conductive plane disposed on a side of said insulating layer opposite to said first conductive plane, and said secondary electron detector is a further annulus of conductive material disposed about said annular conductive plane.

6. The electron beam imaging system of claim 1 wherein said secondary electron detector is an annulus positioned directly on said dielectric layer about said aperture.

7. The electron beam imaging system of claim 1 wherein said secondary electron detector is a semiconductor detector containing a shallow pn junction.

8. The electron beam imaging system of claim 1 wherein said field emission tip is microfabricated from an element selected from the group: silicon, molybdenum, tungsten, niobium.

9. The electron beam imaging system of claim wherein said secondary electron detector is segmented about said aperture, each said segment coupled to an amplifying means for producing individual segment-sensed secondary electron signals.

10. The electron beam imaging system of claim 1 wherein said target comprises a data storage substrate.

11. The electron beam imaging system of claim 1 wherein a plurality of said electron sources, electrostatic lenses and detectors are arranged in an array form for operation in a parallel fashion.

12. The electron beam imaging system of claim 1, wherein said target has a voltage applied which biases said target with respect to a closest surface of said lens, for creating an electric field to provide enhanced electrostatic focusing.

13. The electron beam imaging system of claim 1, wherein said target has a voltage applied which biases said target with respect to said secondary electron detector for enhancing collection of secondary electrons.

* * * * *

UNITED STATES PATENT AND TRADEMARK OFFICE
CERTIFICATE OF CORRECTION

PATENT NO. : 5,122,663
DATED : June 16, 1992
INVENTOR(S) : Tai-Hon P. Chang et al.

It is certified that error appears in the above—identified patent and that said Letters Patent is hereby corrected as shown below:

At col. 2, line 46, "4,791,301" should read --4,791,302--.

At col. 2, line 46, delete "et al.".

At col. 2, line 47, after "Kato" insert --et al.--.

Signed and Sealed this

Fourteenth Day of September, 1993

Attest:

BRUCE LEHMAN

*Attesting Officer*       *Commissioner of Patents and Trademarks*

UNITED STATES PATENT AND TRADEMARK OFFICE
CERTIFICATE OF CORRECTION

PATENT NO. : 5,122,663
DATED : June 16, 1992
INVENTOR(S) : T. H. P. Chang et al.

It is certified that error appears in the above-identified patent and that said Letters Patent is hereby corrected as shown below:

Column 6, line 20, claim 3: after claim, insert --2--

Column 6, line 49, claim 9: after claim, insert --1--

Signed and Sealed this

Twenty-first Day of December, 1993

Attest:

BRUCE LEHMAN

Attesting Officer

Commissioner of Patents and Trademarks